United States Patent
Huang

(10) Patent No.: US 8,547,729 B2
(45) Date of Patent: Oct. 1, 2013

(54) DRAM AND MEMORY ARRAY

(75) Inventor: Wen-Kuei Huang, Hsinchu County (TW)

(73) Assignee: Nanya Technology Corporation, Taoyuan (TW)

( * ) Notice: Subject to any disclaimer, the term of this patent is extended or adjusted under 35 U.S.C. 154(b) by 855 days.

(21) Appl. No.: 12/191,315

(22) Filed: Aug. 14, 2008

(65) Prior Publication Data

US 2009/0257262 A1 Oct. 15, 2009

(30) Foreign Application Priority Data

Apr. 14, 2008 (TW) .............................. 97113488 A

(51) Int. Cl.
*G11C 11/24* (2006.01)

(52) U.S. Cl.
USPC .................... 365/149; 257/301; 257/E27.092

(58) Field of Classification Search
USPC .......... 257/296, 301, 302, 305, 396, E27.092; 365/149

See application file for complete search history.

(56) References Cited

U.S. PATENT DOCUMENTS

| | | | |
|---|---|---|---|
| 6,043,562 A | 3/2000 | Keeth | |
| 6,057,573 A | 5/2000 | Kirsch et al. | |
| 7,135,731 B2 * | 11/2006 | Hsiao et al. | 257/301 |
| 7,321,147 B2 * | 1/2008 | Okajima | 257/301 |
| 2006/0284225 A1 * | 12/2006 | Popp et al. | 257/296 |

FOREIGN PATENT DOCUMENTS

CN 1272688 11/2000

OTHER PUBLICATIONS

"1st Office Action of China Counterpart Application", issued on Mar. 11, 2010, pp. 1-4.

* cited by examiner

*Primary Examiner* — Douglas King
(74) *Attorney, Agent, or Firm* — Jianq Chyun IP Office

(57) ABSTRACT

A dynamic random access memory (DRAM) includes a substrate, a plurality of bit lines, a plurality of word lines, a plurality of recess channels, a plurality of conductive plugs and a plurality of trench capacitors. In the DRAM, the bit lines are disposed on the substrate in a first direction, and the word lines are disposed on the bit lines in a second direction. Each recess channel is in the substrate between two bit lines below the word line, and each conductive plug connects each recess channel and the word lines. Each trench capacitor is disposed in the substrate between two bit lines where the recess channels are not formed. Because the word lines can be electrically connected with the recess channels directly without using an additional chip area, the WL access time can be accelerated without an increase of the chip size.

25 Claims, 15 Drawing Sheets

DRAM AND MEMORY ARRAY

CROSS-REFERENCE TO RELATED APPLICATION

This application claims the priority benefit of Taiwan application serial no. 97113488, filed on Apr. 14, 2008. The entirety of the above-mentioned patent application is hereby incorporated by reference herein and made a part of this specification.

BACKGROUND OF THE INVENTION

1. Field of the Invention

The present invention relates to a memory structure, and in particular, a dynamic random access memory (DRAM) and a memory array.

2. Description of Related Art

In respect of a memory, in order to access memory cells of the same word line in a non-obvious delay time, the structure of the word lines is often designed to be a stitch structure or a segment structure, as disclosed in U.S. Pat. Nos. 6,043,562 or 6,057,573. However, the above-mentioned structures need additional spaces to dispose stitch type word line contacts (stitch type WL contacts) and sub word line driver ICs. Therefore, although the access time is reduced, the chip size is increased. Thereby, the requirements of reducing the WL access time and miniaturizing the chip size can not be satisfied at the same time.

SUMMARY OF THE INVENTION

The present invention is directed to a dynamic random access memory (DRAM) which can reduce the word line (WL) access time without increasing a chip size.

The present invention is directed to a memory array providing additional memory cells per unit area.

The present invention provides a DRAM including a substrate, bit lines, word lines, recess channels, conductive plugs, and trench capacitors. The bit lines are disposed on the substrate in a first direction while the word lines are disposed on the bit lines in a second direction. The recess channels are disposed in the substrate between two bit lines below the word lines. The conductive plugs are used for connecting each of the word lines and the recess channels. The trench capacitors are disposed in the substrate between two bit lines where the recess channels are not formed.

According to one embodiment of the present invention, the DRAM further includes contacts disposed between each of the word lines and the conductive plug below the word line.

According to one embodiment of the present invention, the DRAM further includes a plurality of landing pads and contacts, wherein the landing pads are electrically connected with each of the conductive plugs respectively, and the contacts connect the landing pads and the word lines.

According to one embodiment of the present invention, the DRAM further includes bit line contacts disposed below the bit lines for connecting the substrate and each of the bit lines.

According to one embodiment of the present invention, each of the trench capacitor can be a trench capacitor with a single-sided buried strap (SSBS).

The present invention further provides a memory array including a substrate, bit lines, word lines, recess channels, and conductive plugs. The bit lines are disposed on the substrate in a first direction, while the word lines are disposed on the bit lines in a second direction. The recess channels are disposed in the substrate between two bit lines below the word lines. The conductive plugs connect each of the word lines and the recess channels, and the conductive plugs are electrically connected with each of the word lines in the second direction.

The present invention further provides a memory array including a substrate, bit lines, metal lines, recess channels, and conductive plugs. The bit lines are disposed on the substrate in the first direction, while the metal lines are disposed on the bit lines in the second direction. The recess channels are disposed in the substrate between two bit lines below the word lines. The conductive plugs connect each of the word lines and the recess channels, and the conductive plugs are electrically connected with each of the word lines in the second direction.

According to another embodiment of the present invention, each of the recess channels further includes a dielectric layer, sandwiched by the recess channel and the substrate, wherein the dielectric layer includes a silicon oxide layer, an ONO layer, or a high dielectric constant layer.

According to another embodiment of the present invention, the memory array further includes contacts connecting the conductive plugs and the word lines.

According to another embodiment of the present invention, the memory array further includes a plurality of landing pads and contacts, wherein the landing pads are electrically connected with each of the conductive plugs respectively, and the contacts connect the landing pads and the word lines.

According to each of the embodiments of the present invention, a top of each of the conductive plugs is flush with respective top of the bit lines.

According to each of the embodiments of the present invention, a top of each of the conductive plugs is higher than respective top of the bit lines.

According to each of the embodiments, the word lines are gate structures.

By disposing a recess channel between two bit lines below the word lines and using the conductive plugs to directly connect the word lines to the recess channels, the present invention can accelerate the WL access time without the chip size being increased. Furthermore, when a material of the word lines connected to the conductive plugs is a metal because the material has very low resistance, the conductive plugs can directly connect a main WL driver without going through a sub WL driver. Therefore, comparing with prior arts, the memory array of the present application obtains more memory cells per unit area.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Please refer to the attached figures in the following disclosure so as to better describe the present invention. Several embodiments of the invention are illustrated in the figures. Nevertheless, the invention may be embodied in many different forms and should not be construed as limited to the embodiments set forth herein. The following embodiments are provided to thoroughly and completely disclose the present invention and fully convey the scope of the present invention to persons skilled in the art. For the purpose of clarity, the sizes and relative sizes of each of the layers and regions in the figures may be illustrated in exaggerated proportions correspondingly.

Figure 1:
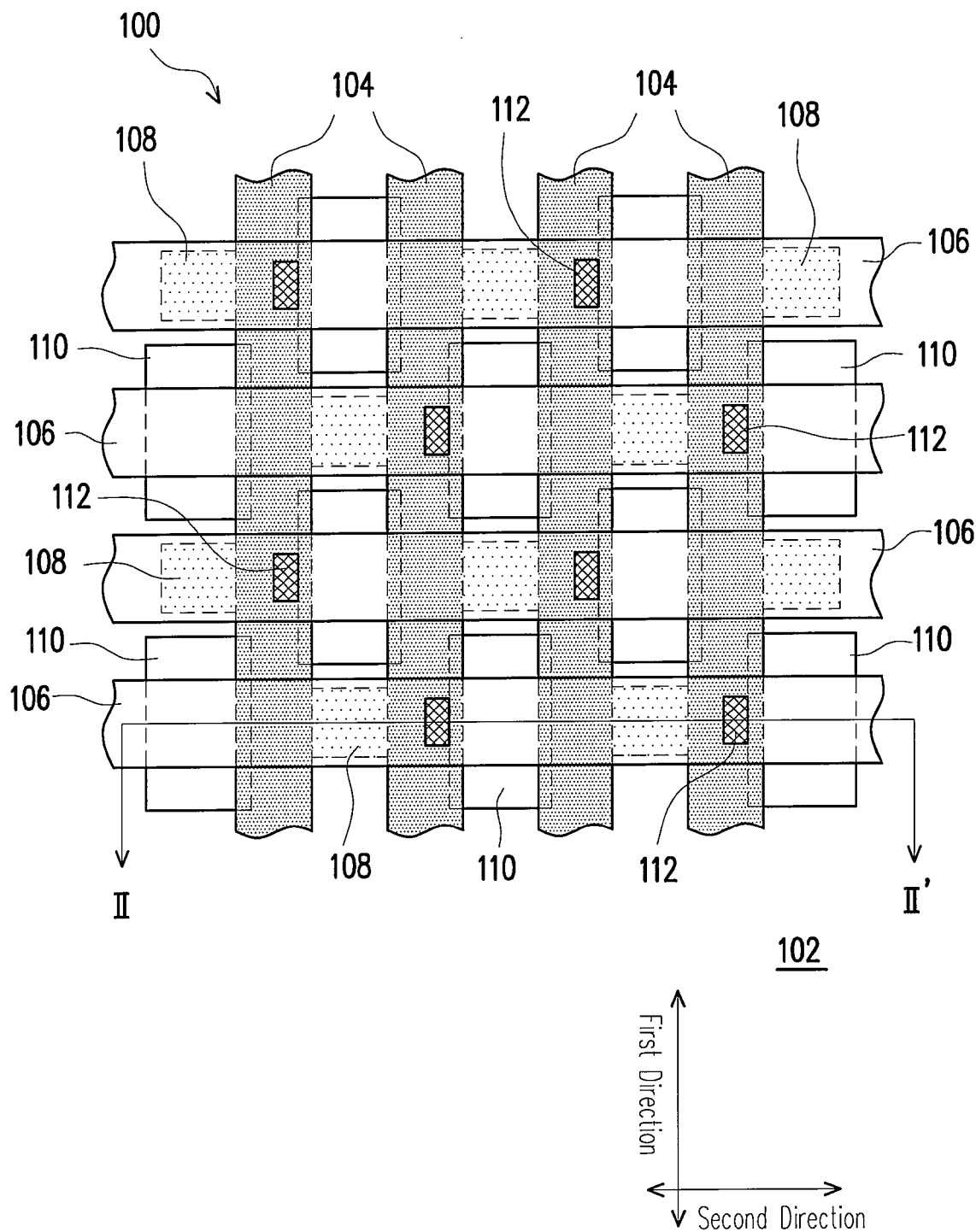
FIG. 1 is a schematic top view of a dynamic random access memory (DRAM) according to a first embodiment of the present invention.

FIG. 1 is a schematic top view of a dynamic random access memory (DRAM) according to a first embodiment of the present invention.

Referring to FIG. 1, a DRAM 100 of the first embodiment includes a substrate 102, a plurality of bit lines 104, a plurality of word lines 106, a plurality of recess channels 108, and a plurality of trench capacitors 110. The bit lines 104 are disposed on the substrate 102 in a first direction while the word lines 106 are disposed on the bit lines 104 in a second direction (perpendicular to a first direction in FIG. 1). The recess channels 108 are embedded in the substrate 102 between two bit lines 104 below the word lines 106. The trench capacitors 110 are disposed in the substrate 102 between two bit lines 104 where the recess channels 108 are not formed. Furthermore, according to the first embodiment, the DRAM further includes bit line contacts 112 below the bit lines 104 for connecting the substrate 102 and each of the bit lines 104. The bit line contacts 112 may be respectively disposed at one side of the trench capacitor 110 in order to optimize the integration of the DRAM.

Several embodiments are provided below as examples of manufacturing the DRAM according the first embodiment.

FIGS. 2A-2H are schematic cross-sectional views illustrating a process flow for manufacturing the DRAM along a line II-II' of FIG. 1. In FIGS. 2A-2H, reference numbers/symbols the same as those of FIG. 1 are used to refer to the same elements or regions.

Figure 2A:
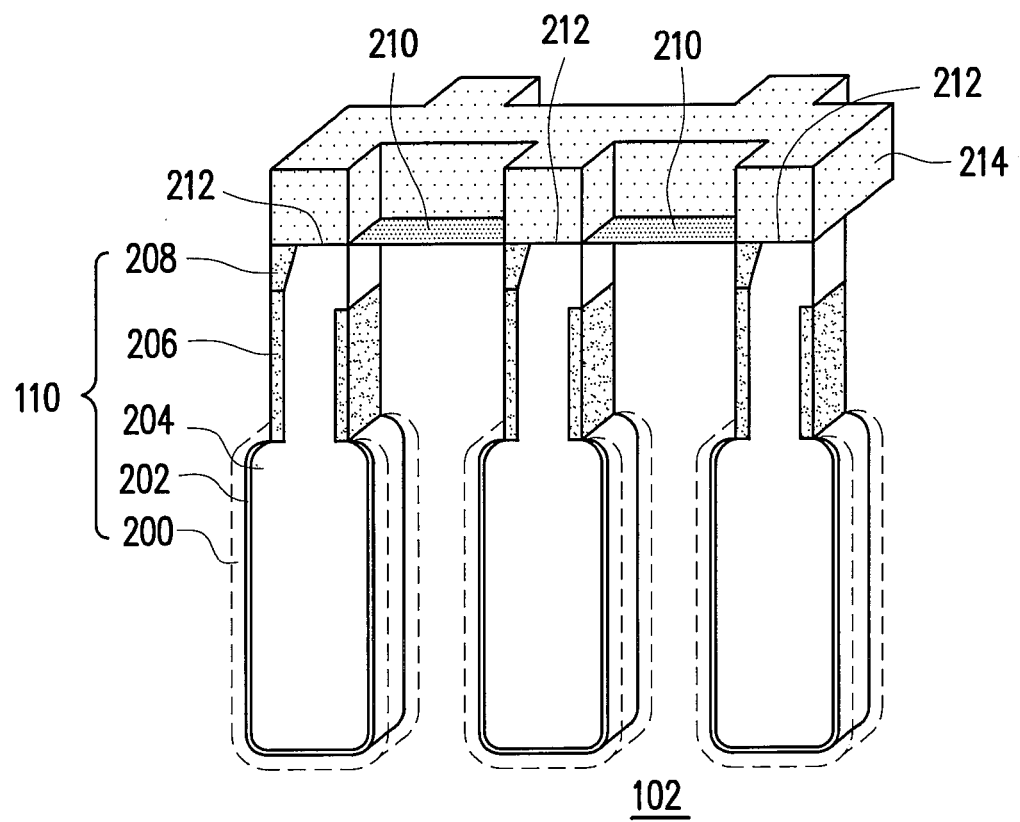
FIGS. 2A-2H are schematic cross-sectional views illustrating a process flow for manufacturing the DRAM along a line II-II' of FIG. 1.

Please refer to FIG. 2A at first. Several trench capacitors 110 are formed in the substrate 102, and each of the trench capacitors 110 herein is, for example, a trench capacitors with a single-sided buried strap (SSBS), wherein the trench capacitors 110 are, for example, constituted by a buried diffusion region 200, a dielectric layer 202, and a capacitance conductive layer 204, and have a collar oxide layer 206 and a single-sided isolation layer 208. After that, an active area (AA) 210 is formed in the substrate 102, and an insulating layer 214 is formed on the substrate 102 to cover tops 212 of the trench capacitors 110 and to expose the insulating layer 214 of the active area 210. Moreover, FIG. 2A is a perspective view illustrating the disposition of the active area 210 and the trench capacitors 110.

Figure 2B:
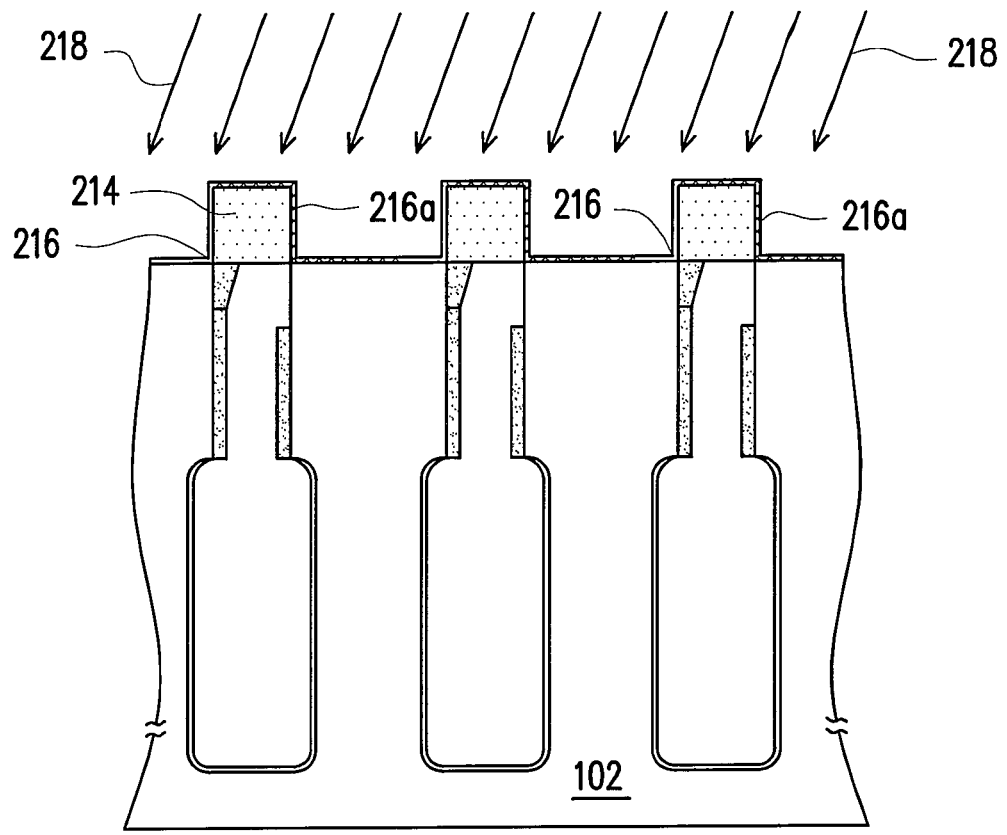

Next, referring to FIG. 2B, an amorphous silicon layer 216 is conformally formed on the substrate 102 and the insulating layer 214, wherein the buried diffusion region and the active area are omitted to simplify the figures. Then, a single-sided ion implantation process 218 is performed to convert a portion of the amorphous silicon layer 216 to a doped amorphous silicon layer 216a, wherein an ion source of the single-sided ion implantation process 218 includes, for example, $BF_2$ or B.

Figure 2C:
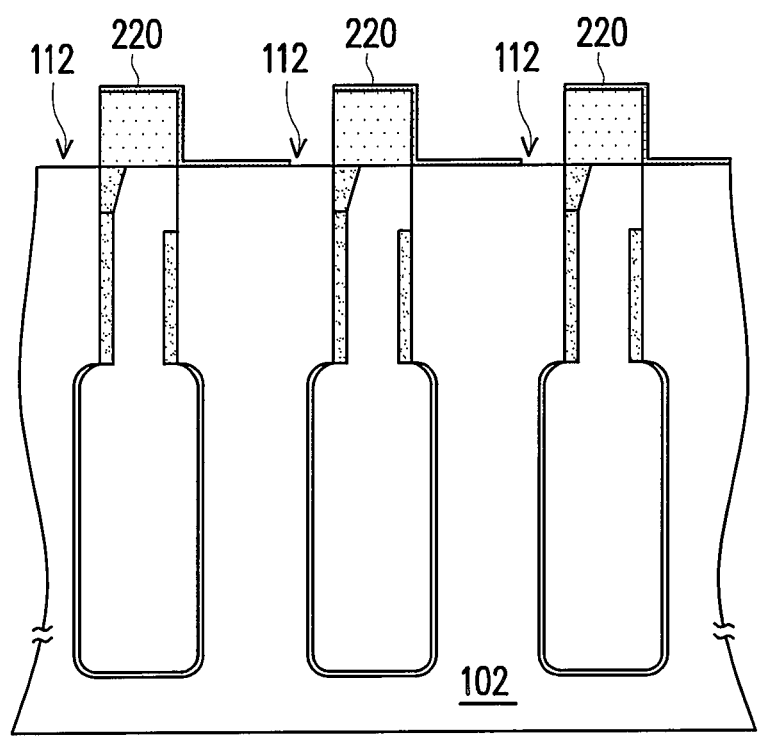

After that, referring to FIG. 2C, the amorphous silicon layer 216 is removed (see FIG. 2B) to expose a portion of the substrate 102 where the bit line contacts 112 are predetermined to be formed. A method of removing the amorphous silicon layer 216 includes, for example, performing a wet etching process by using an etchant with different etching rates for etching the amorphous silicon layer 216 and the doped amorphous silicon layer 216a (see FIG. 2B). Thereafter, oxidize the remained doped amorphous silicon layer 216a to form a silicon oxide layer 220.

Figure 2D:
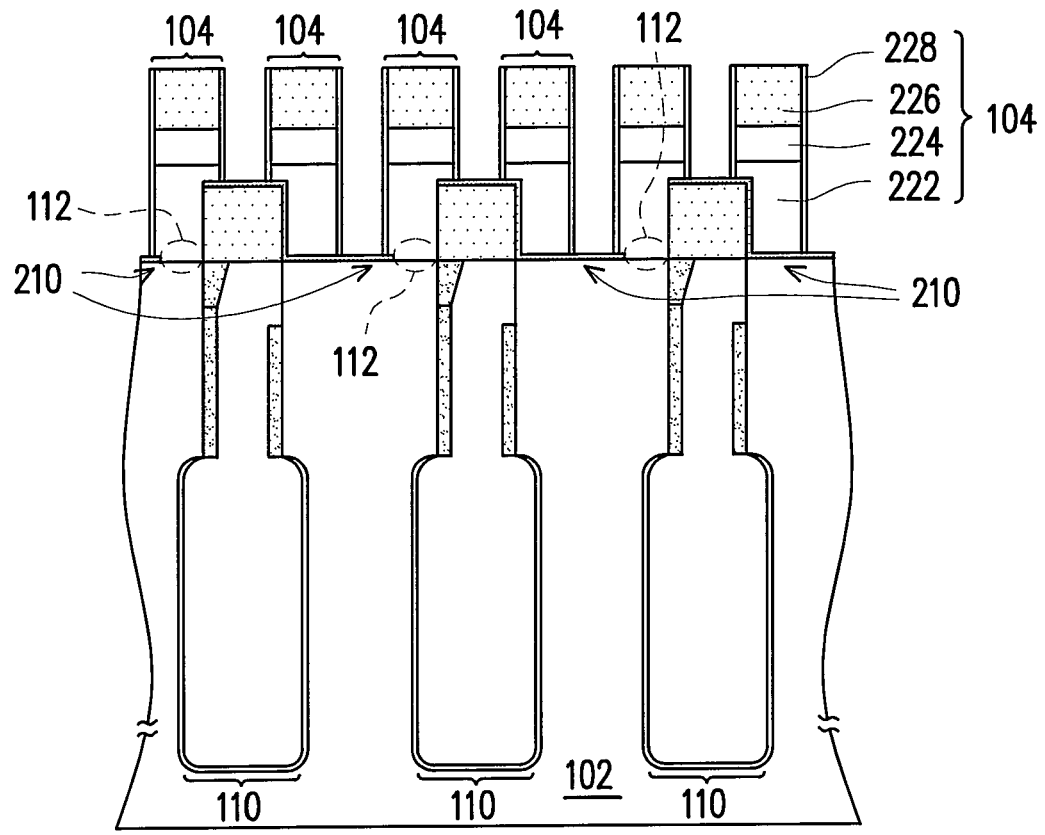

Afterwards, referring to FIG. 2D, the bit lines 104 are formed on the substrate 102. According to the present embodiment, the gate structures are used as the bit lines 104, so the gate structures may be formed at the same time of manufacturing the bit lines 104. Taking the present figure as an example, the bit lines 104 include a polysilicon layer 222, a metal silicide layer 224, a silicon nitride layer 226, and an insulating layer 228 at side walls of the above-mentioned layers. Certainly, it is viable to manufacture only one conductor layer as the bit lines of the present invention according to actual needs. Each of the bit lines 104 is distributed at two sides of the trench capacitors 110 and covers a portion of the active area 210. Thereby, at the same time when the bit lines 104 are formed, the bit line contacts 112 are also formed, and thereby the bit lines 104 are electrically connected to the substrate 102 by means of the bit line contacts 112.

Figure 2E:
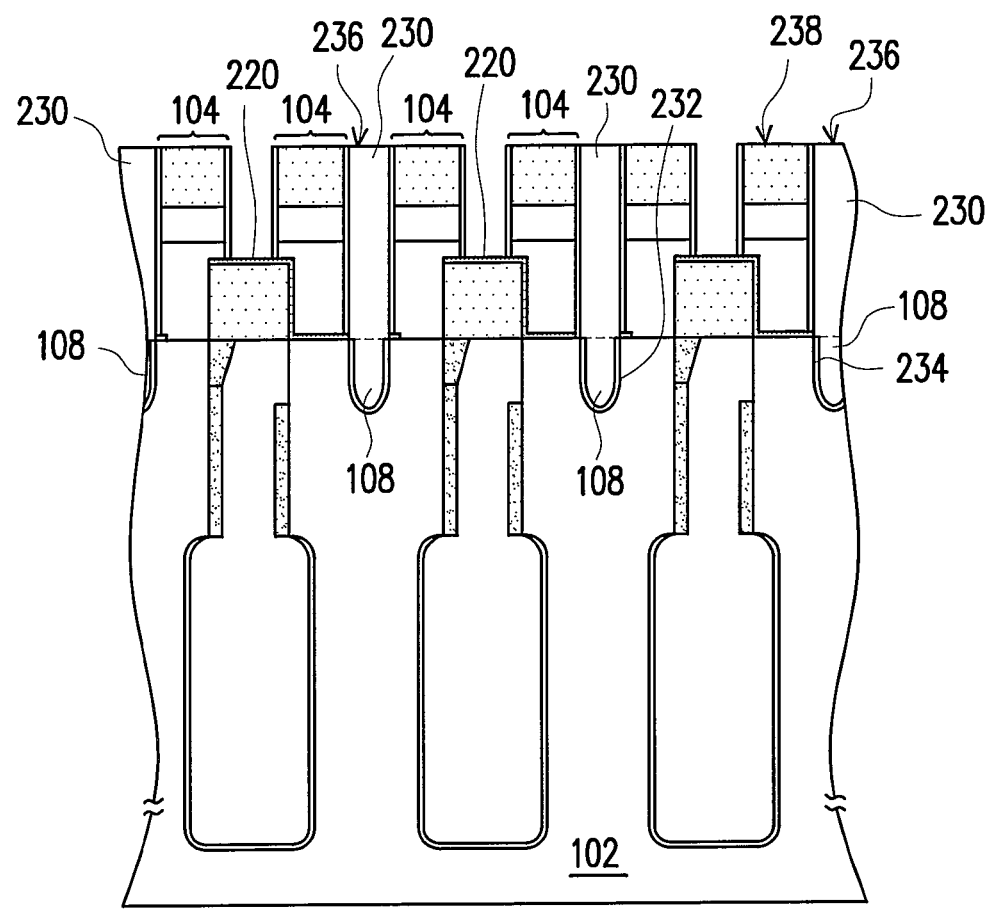

Then, referring to FIG. 2E, the recess channels 108 are formed between the bit lines 104 on the active area 210 (see FIG. 2D) and conductive plugs 230 are formed on the recess channels 108. The steps include, for example, removing the silicon oxide layer 220 exposed on the active area 210 by using the bit lines 104 as an etching mask; removing the exposed substrate 102 to form trenches 232; and forming dielectric layers 234 at inner walls of the trenches 232, wherein the dielectric layers 234 is the silicon oxide layer for example. Next, the recess channels 108 and the conductive plugs 230 are respectively formed by filling a conductor material in the trenches 232 and filling another conductor material between the bit lines 104. Alternatively, the same conductor material can be directly used to be filled in the trenches 232 and between the bit lines 104 to form the recess channels 108 and the conductive plugs 230 as the self-aligned conductive plugs. In the present figure, a top 236 of each of the conductive plugs 230 is flush with respective top 238 of each of the bit lines 104.

Figure 2F:
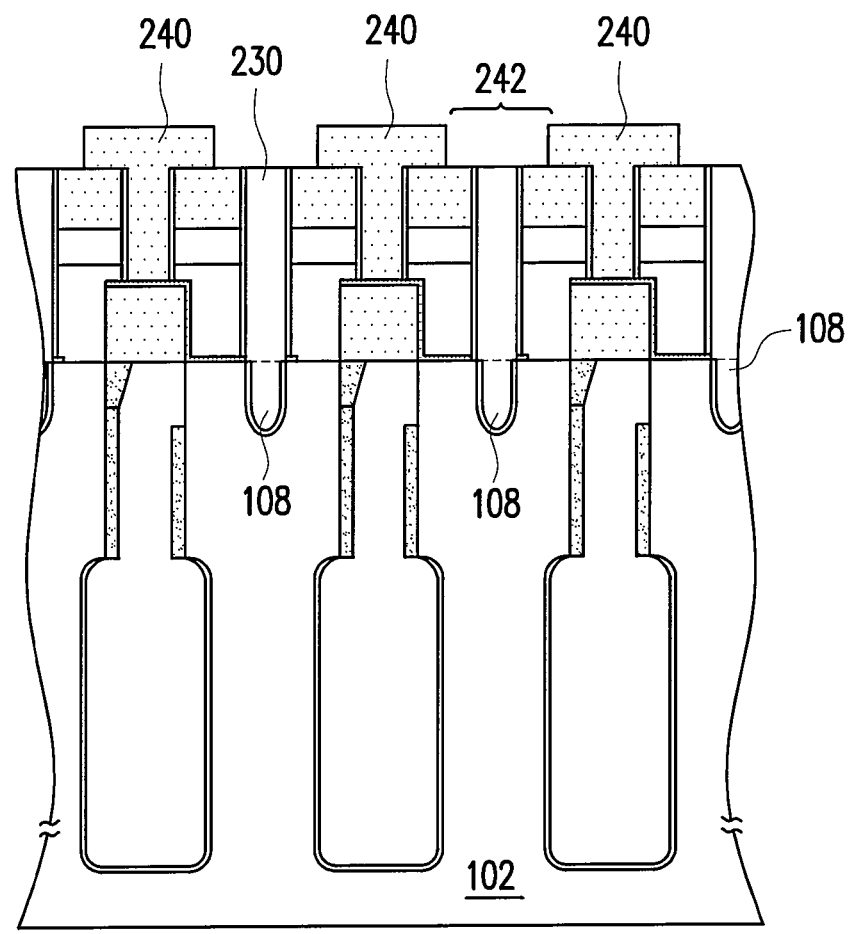

After that, referring to FIG. 2F, a dielectric layer 240 is formed on the substrate 102, and the dielectric layer 240 has several openings 242 exposing the conductive plugs 230.

Figure 2G:
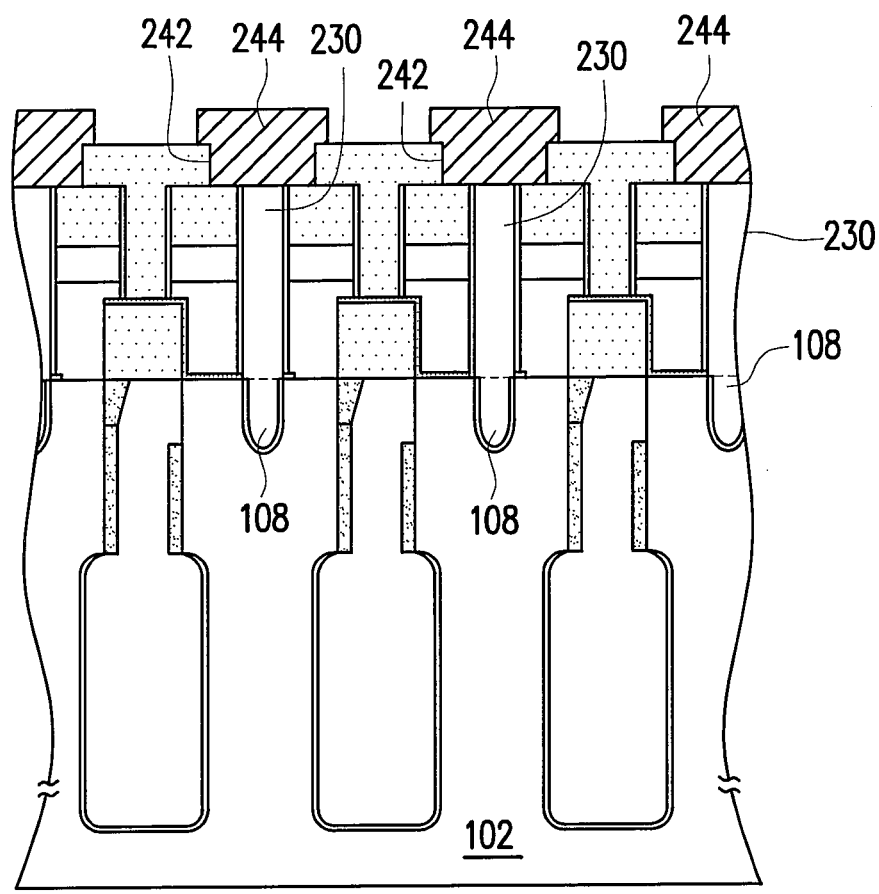

Thereafter, referring to FIG. 2G, landing pads 244 electrically connected to the conductive plugs 230 are formed in the openings 242, thereby concurrently forming a M0 metallic layer of a peripheral circuit region.

Figure 2H:
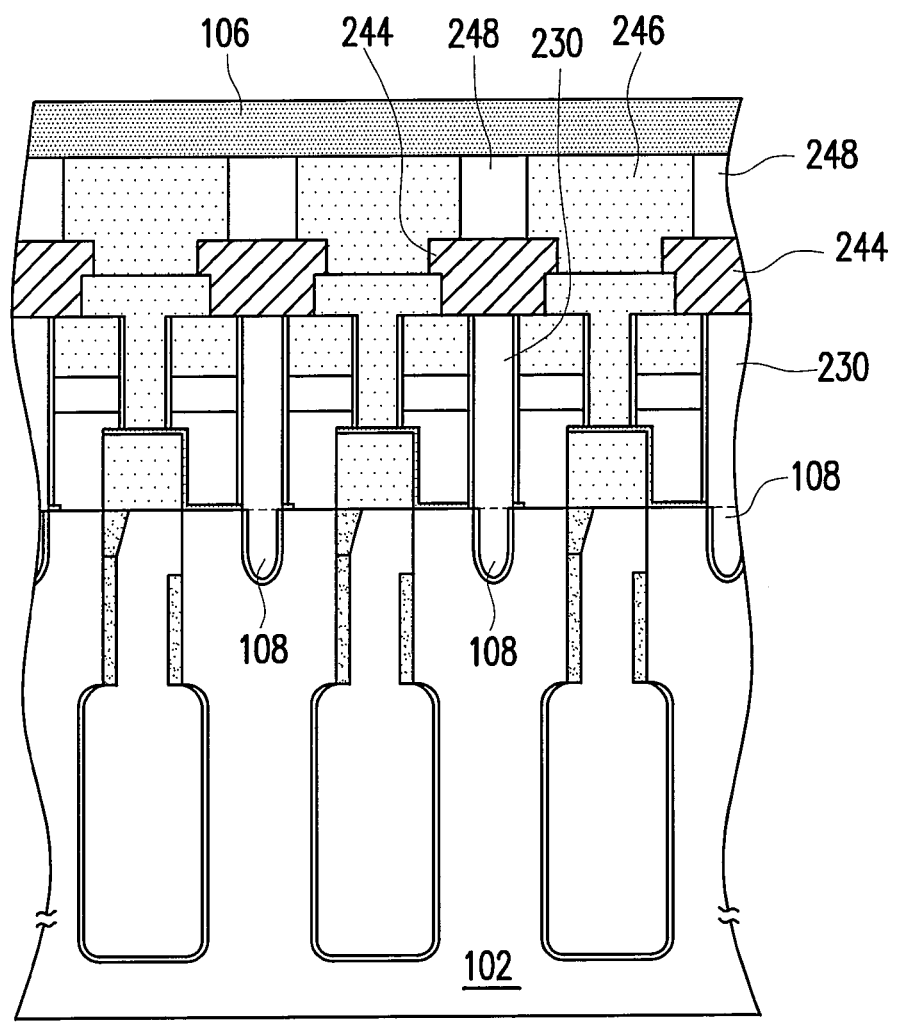

Afterwards, referring to FIG. 2H, another dielectric layer 246 is formed on the substrate 102, and contacts 248 connected to the landing pads are formed in the dielectric layer 246. Finally, the word lines 106 are formed on the dielectric layer 246, and by using the contacts 248 and the landing pads 244 in the same direction, the recess channels 108 are electrically connected to the word lines 106 through the conductive plugs 230. At this moment, the manufacture of an M1 metallic layer is completed simultaneously when the word lines 106 are formed.

In addition to the process flow illustrated by FIGS. 2A-2H, the first embodiment of manufacturing the DRAM can be implemented in different forms listed below.

Figure 3A:
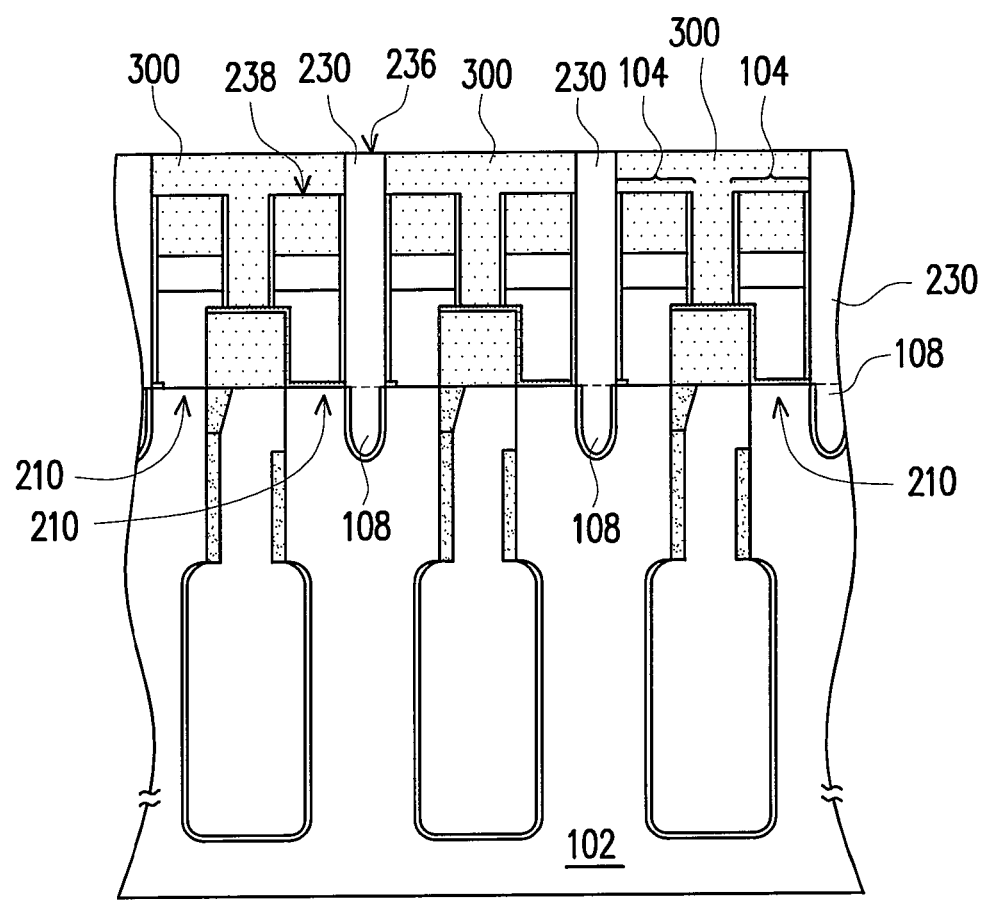
FIGS. 3A-3B are schematic cross-sectional views illustrating another process flow for manufacturing the DRAM along the line II-II' of FIG. 1.
Figure 3B:
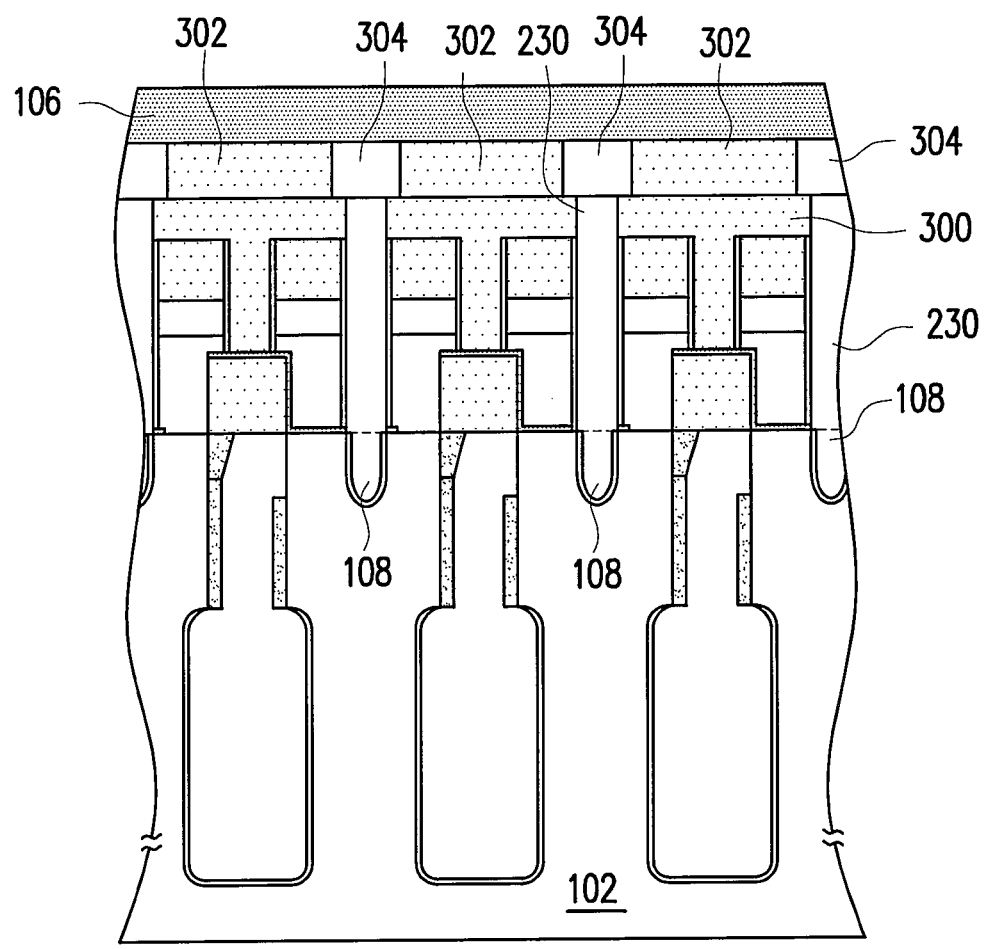

FIGS. 3A-3B are schematic cross-sectional views illustrating another process flow for manufacturing the DRAM along the line II-II' of FIG. 1. The preceding process is as shown by FIGS. 2A-2D. In FIGS. 3A-3B, reference numbers/symbols the same as those of FIGS. 2A-2D are used to refer to the same elements or regions.

Referring to FIG. 3A, after the bit lines 104 are formed, the conductive plugs 230 and the recess channels 108 are formed between the bit lines 104 on the active area 210, wherein the top 236 of each of the conductive plugs 230 is higher than respective top 238 of each of the bit lines 104. Moreover, a dielectric layer 300 is sandwiched by the conductive plugs 230.

Then, referring to FIG. 3B, another dielectric layer 302 is formed on the substrate 102, and contacts 304 are formed in a dielectric layer 302, wherein the contacts 304 are connected to the conductive plugs 230. Finally, the word lines 106 are formed on the dielectric layer 302, and by using the contacts 304 in the same direction, the recess channels 108 are electrically connected to the word lines 106 through the conductive plugs 230.

Figure 4:
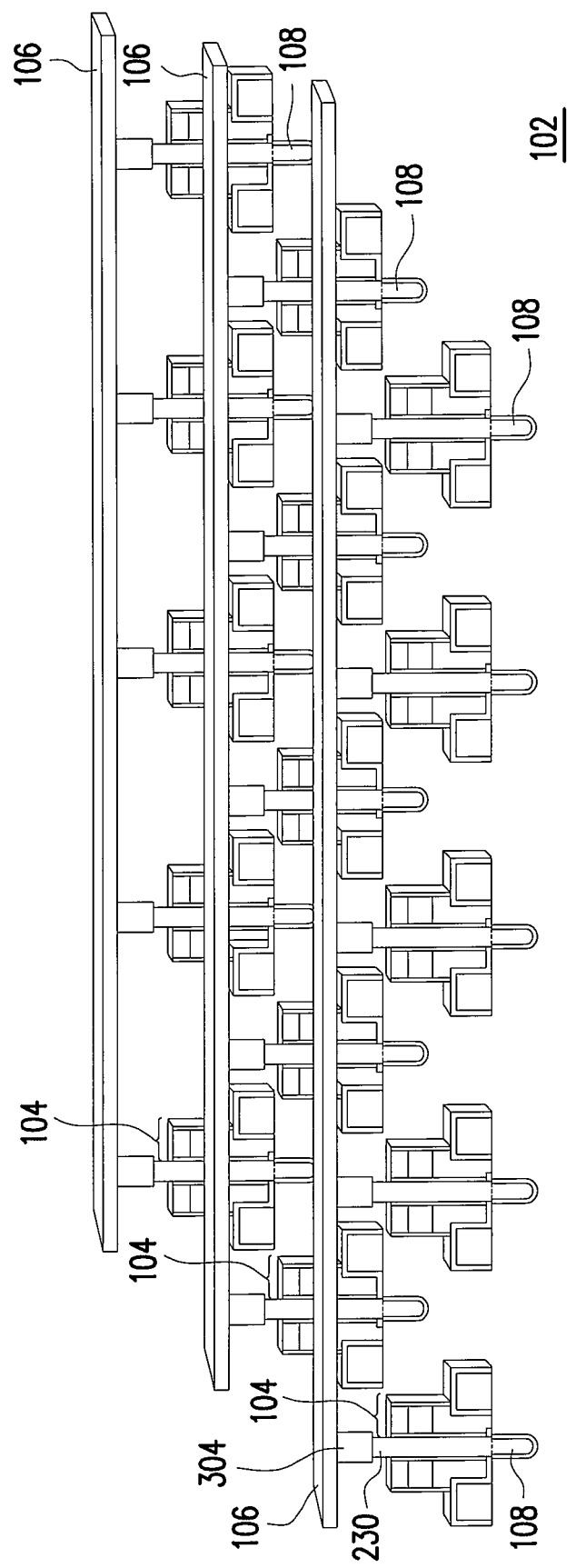
FIG. 4 is a perspective view illustrating a structure of FIG. 3B.
Figure 5:
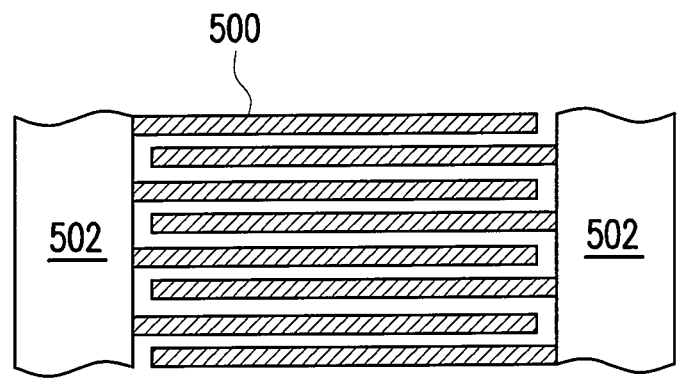
FIG. 5 is a schematic view of FIG. 4.

Hereinafter, a perspective view is used for illustration. Referring to FIG. 4, FIG. 4 is the perspective view of the structure of FIG. 3B. For clarity and easy understanding, the trench capacitors are omitted and each of the bit lines 104 is shown in sections. It can be known from FIG. 4 that, according to DRAM of the present invention, by disposing the recess channel 108 in the substrate 102 between two bit lines 104 below the word lines 106, and by using the conductive plugs 230 to connect the recess channels 108 directly to the word lines 106, the WL access time can be accelerated without the chip size being increased. Moreover, as shown by FIG. 5, a metal line 500 with low resistance is used as the word line, and therefore the word lines (the metal lines 500) can be connected to a main WL driver 502 without going through a sub WL driver. Thereby, the chip size is greatly reduced. At this moment, the manufacture of the metal lines 500 is completed at the same time when the manufacture of the M1 metallic layer of the peripheral circuit region is completed.

Figure 6:
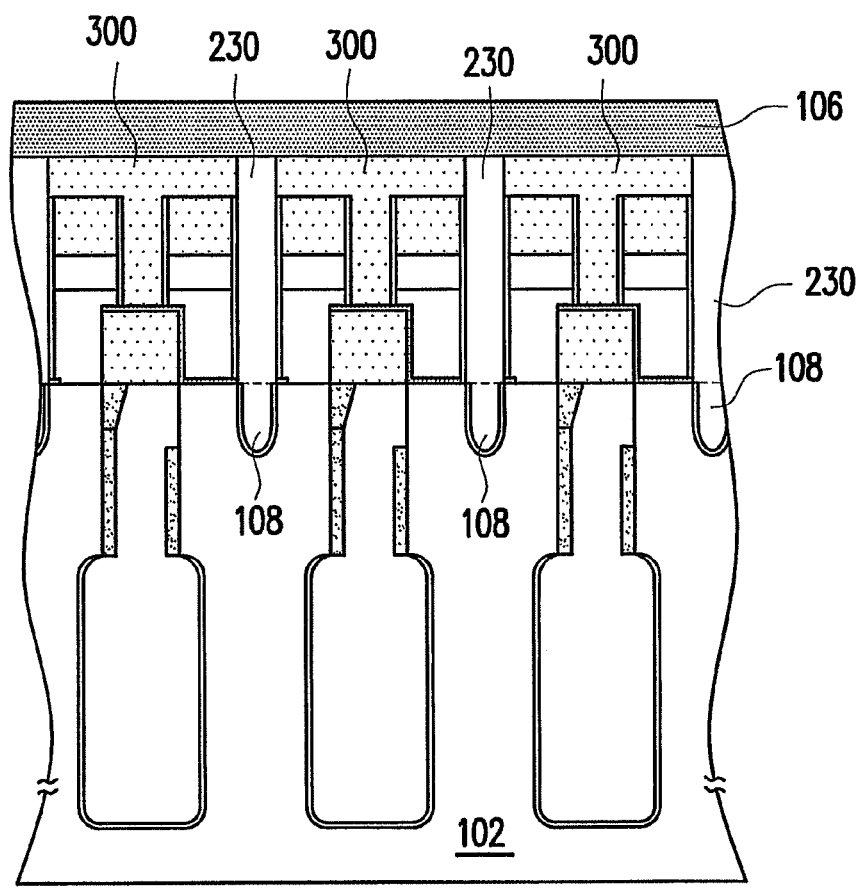
FIG. 6 is a schematic cross-sectional view illustrating still another process flow for manufacturing the DRAM along the line II-II' of FIG. 1.

FIG. 6 are schematic cross-sectional views illustrating a process flow for manufacturing the DRAM along a line II-II' of FIG. 1. The preceding process with respect to FIG. 6 is as shown by FIGS. 2A-2D and 3A. In FIG. 6, reference numbers/symbols the same to those of FIG. 3A are used to refer to the same elements or regions. Referring to FIG. 6, after the recess channels 108 and the conductive plugs 230 are formed, the word lines 106 are directly formed on the conductive plugs 230 and the dielectric layer 300 to connect the recess channels 108 in the same direction through the conductive plugs 230.

Figure 7:
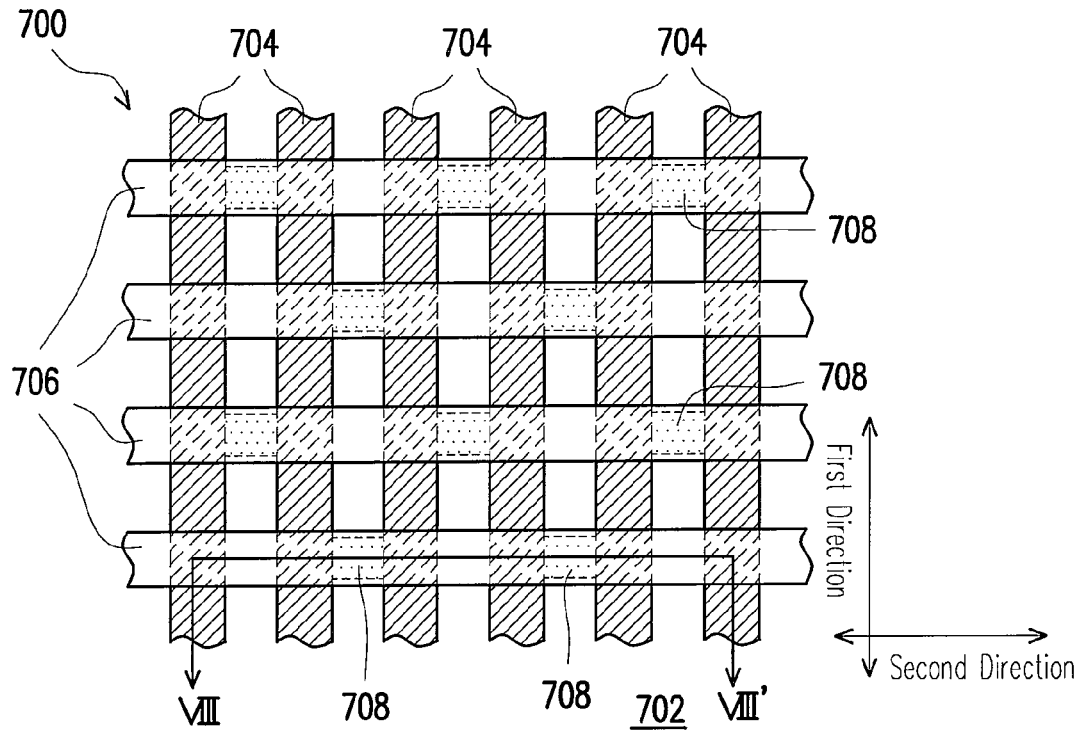
FIG. 7 is a top view illustrating a memory array according to a second embodiment of the present invention.
Figure 8:
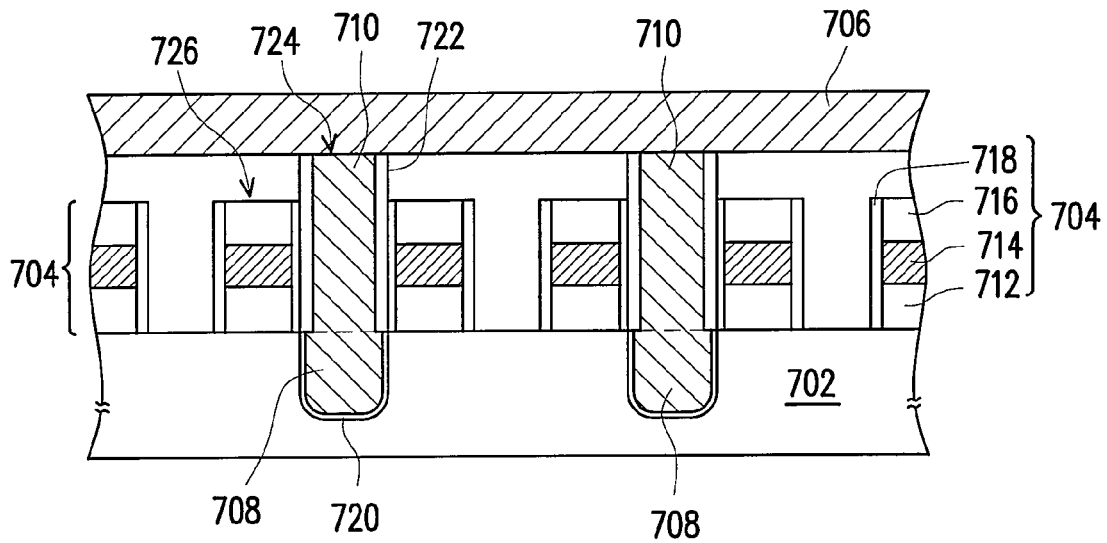
FIG. 8 is a cross-sectional view illustrating the memory array along a line VIII-VIII' of FIG. 7.

Furthermore, the concept of the present invention can be applied to a memory array, as shown by FIGS. 7 and 8. FIG. 7 is a top view illustrating the memory array according to a second embodiment of the present invention. FIG. 8 is a cross-sectional view illustrating the memory array along a line VIII-VIII' of FIG. 7.

Referring to FIGS. 7 and 8 at the same time, a memory array 700 of the second embodiment includes a substrate 702, bit lines 704, word lines 706, recess channels 708, and conductive plugs 710. The bit lines 704 are disposed on the substrate 702 in the first direction while the word lines 706 are disposed on the bit lines in the second direction. Moreover, according to the present embodiment, the gate structures are used to be the bit lines 704, wherein the gate structures include a polysilicon layer 712, a metal silicide layer 714, a silicon nitride layer 716, and an insulating layer 718 at side walls of the above-mentioned layers. Certainly, it is viable to manufacture only one conductor layer as the bit lines of the present invention according to actual needs. The recess channels 708 are in the substrate 702 between two bit lines 704 below the word lines 706. The recess channels 708 in the second direction are electrically connected to each of the word lines 706 through the conductive plugs 710. Each of the recess channels 708 can further include a dielectric layer 720 in the substrate 702 and sandwiched by the substrate 702 and each of the recess channels 708. The dielectric layer 720 is, for example, the silicon oxide layer, an ONO layer, or a high dielectric constant layer. Moreover, the present embodiment further includes an insulating layer 722 between the conductive plugs 710 and the bit lines 704. In FIG. 8, although a top 724 of each of the conductive plugs 710 is higher than respective top 726 of each of the bit lines 704, the top of each of the conductive plugs 710 can be flush with respective top of each of the bit lines 704 according to actual designs and needs. Furthermore, in respect of connecting the word lines 706 to the conductive plugs 710, the contacts or the landing pads can be used as interconnects.

In summary, the present invention is characterized in that, a recess channel embedded is disposed in the substrate between two bit lines below the word lines to be directly connected to the word lines through the conductive plugs. Therefore, the WL access time is accelerated without the chip size being increased. Moreover, the structure of the present invention and the structure of a peripheral circuit can be manufactured together, so that the complexity of the manufacture is not increased. Furthermore, when a material of the word lines connected to the conductive plugs is a metal with low resistance, by using the structure of the present invention, the main WL driver is directly connected without going through the sub WL driver. Therefore, when the present invention is applied to the memory array, the memory array obtains more memory cells per unit area.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A dynamic random access memory (DRAM), comprising:
   a substrate;
   an active area, in the substrate;
   an insulating layer, on the substrate, and the active area is exposed from the insulating layer;
   a plurality of bit lines, disposed on the substrate in a first direction, wherein each of the bit lines covers a portion of the active area;
   a plurality of word lines, disposed on the bit lines in a second direction;
   a plurality of embedded channels, disposed in the substrate between two adjacent bit lines below the word lines in the active area;
   a plurality of conductive plugs, connecting each of the word lines and the embedded channels, wherein each of the conductive plugs is on the active area;

a plurality of trench capacitors, disposed in the substrate between the two adjacent bit lines except where the embedded channels are disposed, wherein a plurality of tops of the trench capacitors is covered by the insulating layer;

a silicon oxide layer, disposed on a first sidewall of the insulating layer to be sandwiched by a portion of the insulating layer and one of the bit lines disposed at a first side of each of the trench capacitors, and the silicon oxide layer is further sandwiched by a surface of the substrate and the one of the bit lines at the first side of each of the trench capacitors; and a bit line contact, disposed between the substrate and another of the bit lines disposed at a second side of each of the trench capacitors, wherein the second side is opposite to the first side, and the bit line contact is directly contacted with a second sidewall of the insulating layer, wherein the second sidewall is opposite to the first sidewall.

2. The DRAM according to claim 1, further comprising a plurality of contacts, disposed between each of the word lines and each of the conductive plugs below the word lines.

3. The DRAM according to claim 2, further comprising:
a plurality of landing pads, electrically connected with each of the conductive plugs respectively; and
a plurality of contacts, connecting the landing pads and the word lines.

4. The DRAM according to claim 2, wherein a plurality of bit line contacts is disposed below the bit lines to connect the substrate and the bit lines.

5. The DRAM according to claim 1, wherein each of the bit lines comprises a gate structure.

6. The DRAM according to claim 1, wherein each of the trench capacitors comprises a trench capacitor with a single-sided buried strap (SSBS).

7. The DRAM according to claim 1, wherein a top of each of the conductive plugs is flush with respective top of the bit lines.

8. The DRAM according to claim 1, wherein a top of each of the conductive plugs is higher than respective top of the bit lines.

9. A memory array, comprising:
a substrate;
a plurality of active areas, in the substrate;
an insulating layer, on the substrate, and the active areas are exposed from the insulating layer;
a plurality of bit lines, disposed on the substrate in a first direction, wherein each of the bit lines covers a portion of the active area;
a plurality of word lines, disposed on the bit lines in a second direction;
a plurality of embedded channels, disposed in the substrate between two bit lines below the word lines in the active areas;
a plurality of conductive plugs, connecting each of the word lines and the embedded channels the conductive plugs being electrically connected with each of the word lines in the second direction, wherein each of the conductive plugs is on each of the active areas;
a silicon oxide layer, disposed on a first sidewall of the insulating layer to be sandwiched by a portion of the insulating layer and one of the bit lines disposed at a first side of each of the trench capacitors, and the silicon oxide layer is further sandwiched by a surface of the substrate and the one of the bit lines at the first side of each of the trench capacitors; and a bit line contact, disposed between the substrate and another of the bit lines disposed at a second side of each of the trench capacitors, wherein the second side is opposite to the first side, and the bit line contact is directly contacted with a second sidewall of the insulating layer, wherein the second sidewall is opposite to the first sidewall.

10. The memory array according to claim 9, wherein a top of each of the conductive plugs is flush with respective top of the bit lines.

11. The memory array according to claim 9, wherein a top of each of the conductive plugs is higher than respective top of the bit lines.

12. The memory array according to claim 11, further comprising a plurality of contacts connecting the conductive plugs and the word lines.

13. The memory array according to claim 9, wherein each of the embedded channels further comprises a dielectric layer, sandwiched by the embedded channel and the substrate.

14. The memory array according to claim 13, wherein the dielectric layer comprises a silicon oxide layer, an ONO layer, or a high dielectric constant layer.

15. The memory array according to claim 14, further comprising:
a plurality of landing pads, electrically connected with each of the conductive plugs respectively; and
a plurality of contacts, connecting the landing pads and the word lines.

16. The memory array according to claim 9, wherein each of the bit lines comprises a gate structure.

17. A memory array, comprising:
a substrate;
an active area, in the substrate;
an insulating layer, on the substrate, and the active area is exposed from the insulating layer;
a plurality of bit lines, disposed on the substrate in a first direction, wherein each of the bit lines covers a portion of the active area;
a plurality of metal lines, disposed on the bit lines in a second direction;
a plurality of embedded channels, disposed in the substrate between two bit lines below the metal lines in the active area;
a plurality of conductive plugs, connecting each of the metal lines and the embedded channels, the conductive plugs being electrically connected with each of the metal lines in the second direction, wherein each of the conductive plugs is on the active area;
a silicon oxide layer, disposed on a first sidewall of the insulating layer to be sandwiched by a portion of the insulating layer and one of the bit lines disposed at a first side of each of the trench capacitors, and the silicon oxide layer is further sandwiched by a surface of the substrate and the one of the bit lines at the first side of each of the trench capacitors; and a bit line contact, disposed between the substrate and another of the bit lines disposed at a second side of each of the trench capacitors, wherein the second side is opposite to the first side, and the bit line contact is directly contacted with a second sidewall of the insulating layer, wherein the second sidewall is opposite to the first sidewall.

18. The memory array according to claim 17, wherein the metal lines are directly connected to a main word line driver.

19. The memory array according to claim 17, wherein a top of each of the conductive plugs is flush with respective top of the bit lines.

20. The memory array according to claim 17, wherein a top of each of the conductive plugs is higher than respective tops of the bit lines.

21. The memory array according to claim 20, further comprising a plurality of contacts connecting the conductive plugs and the metal lines.

22. The memory array according to claim 17, wherein each of the embedded channels further comprises a dielectric layer, sandwiched by the embedded channel and the substrate.

23. The memory array according to claim 22, wherein the dielectric layer comprises a silicon oxide layer, an ONO layer, or a high dielectric constant layer.

24. The memory array according to claim 17, further comprising:
- a plurality of landing pads, electrically connected with each of the conductive plugs respectively; and
- a plurality of contacts, connecting the landing pads and the metal lines.

25. The memory array according to claim 17, wherein each of the bit lines comprises a gate structure.

* * * * *